(12) United States Patent
Park

(10) Patent No.: US 9,224,432 B2
(45) Date of Patent: Dec. 29, 2015

(54) SEMICONDUCTOR PACKAGE

(71) Applicant: Samsung Electronics Co., Ltd., Suwon-si (KR)

(72) Inventor: Chul Park, Hwaseong-si (KR)

(73) Assignee: Samsung Electronics Co., Ltd. (KR)

( * ) Notice: Subject to any disclaimer, the term of this patent is extended or adjusted under 35 U.S.C. 154(b) by 21 days.

(21) Appl. No.: 14/077,656

(22) Filed: Nov. 12, 2013

(65) Prior Publication Data

US 2014/0218998 A1 Aug. 7, 2014

(30) Foreign Application Priority Data

Feb. 4, 2013 (KR) ........................ 10-2013-0012149

(51) Int. Cl.
G11C 5/00 (2006.01)
G11C 5/02 (2006.01)
G11C 5/06 (2006.01)
H05K 1/11 (2006.01)
H01L 23/50 (2006.01)
H01L 25/18 (2006.01)
H05K 3/28 (2006.01)
H01L 23/498 (2006.01)

(52) U.S. Cl.
CPC ................ G11C 5/063 (2013.01); H01L 23/50 (2013.01); H01L 25/18 (2013.01); H05K 1/113 (2013.01); *H01L 23/49816* (2013.01); *H01L 23/49827* (2013.01); *H01L 23/49855* (2013.01); *H01L 2224/10* (2013.01); *H01L 2224/48091* (2013.01); *H01L 2224/73265* (2013.01); *H01L 2225/0651* (2013.01); *H01L 2225/06506* (2013.01); *H01L 2225/06527* (2013.01); *H01L 2225/06568* (2013.01); *H05K 3/284* (2013.01); *H05K 2201/10212* (2013.01)

(58) Field of Classification Search
USPC ........ 365/51, 52, 63; 257/678, 685, 686, 730, 257/738, 777, 778
See application file for complete search history.

(56) References Cited

U.S. PATENT DOCUMENTS

| 6,054,767 | A | * | 4/2000 | Chia et al. ..................... 257/738 |
| 6,252,305 | B1 | * | 6/2001 | Lin et al. ........................ 257/777 |
| 6,442,056 | B2 | * | 8/2002 | Nuxoll et al. ................... 365/52 |
| 6,492,253 | B1 | | 12/2002 | Chia et al. |
| 6,826,066 | B2 | * | 11/2004 | Kozaru ........................... 365/52 |
| 7,113,417 | B2 | * | 9/2006 | Pochmuller ..................... 365/51 |
| 7,120,056 | B2 | | 10/2006 | Kim et al. |

(Continued)

FOREIGN PATENT DOCUMENTS

| JP | 11040563 | 2/1999 |
| JP | 11177040 | 7/1999 |

(Continued)

OTHER PUBLICATIONS

Kim et al., US 2013/0021760 A1 (U.S. Appl. No. 13/541,962).*

*Primary Examiner* — Trong Phan
(74) *Attorney, Agent, or Firm* — Onello & Mello, LLP.

(57) ABSTRACT

In a semiconductor package, a circuit pattern is arranged in a circuit board and contact pads on the circuit board are connected with the circuit pattern. Contact terminals contact external contact elements on a first surface of the circuit board. An integrated circuit (IC) chip structure is mounted on the circuit board and electrically connected to the inner circuit pattern. An operation controller on the circuit board controls operation of the semiconductor package according to the package users' individual choice.

13 Claims, 6 Drawing Sheets

(56) References Cited

U.S. PATENT DOCUMENTS

| | | | |
|---|---|---|---|
| 7,238,962 B2 * | 7/2007 | Kim | 257/730 |
| 7,725,785 B2 | 5/2010 | Her | |
| 8,310,854 B2 * | 11/2012 | MacWilliams et al. | 365/52 |
| 8,634,221 B2 * | 1/2014 | Thayer | 365/52 |
| 8,760,902 B2 * | 6/2014 | Yokou | 365/63 |
| 8,767,430 B2 * | 7/2014 | Gillingham et al. | 365/51 |
| 8,873,282 B2 * | 10/2014 | Min | 257/730 |
| 8,901,750 B2 * | 12/2014 | Park et al. | 257/777 |
| 2009/0065949 A1 | 3/2009 | Yim et al. | |

FOREIGN PATENT DOCUMENTS

| | | |
|---|---|---|
| JP | 2000216342 | 8/2000 |
| KR | 0344838 | 7/2002 |
| KR | 20090110484 | 10/2009 |

* cited by examiner

SEMICONDUCTOR PACKAGE

CROSS-REFERENCE TO RELATED APPLICATIONS

This application claims the benefit of Korean Patent Application No. 10-2013-0012149 filed on Feb. 4, 2013 in the Korean Intellectual Property Office, the disclosure of which is incorporated herein in its entirety by reference.

BACKGROUND

1. Field

Exemplary embodiments in accordance with principles of inventive concepts relate to a semiconductor package, and more particularly, to a semiconductor package having a variable data interconnector that may be selectively varied according to users' choice.

2. Description of the Related Art

Semiconductor packages may be manufactured, for example, by mounting at least one integrated circuit (IC) chip structure onto a single die pad. An electrode pad of the IC chip structure usually makes contact with one of a plurality of contact pads in the die pad and the IC chip structure is covered by an encapsulant. The contact pad is usually connected with external contact elements. As electronic systems including semiconductor packages have been improved to have a small size together with high performance, the semiconductor package for the electronic system has also developed into a small-sized package, such as a flip chip package, having a single IC chip structure or a high performance package, such as a multichip package, having a plurality of stacked IC chips.

The application field of the IC chip structure has been enlarged to mechanical industries with automotive semiconductor chips and a biological and medical industry with semiconductor chips for medical devices, for example. As a result, the data interconnector for electrically communicating between external data sources and semiconductor chips (that is, IC chips) has been modified according to usage characteristics and requirements of various application fields of the IC chip. For example, the data transfer structure between a semiconductor package and an external data source has been diversified into bit organizations of X4, X8 and X16, and the number of allowable channels can be varied in the multichip package.

However, conventional semiconductor packages are usually manufactured by a series of standard processing steps, and thus the standard manufacturing processes cannot meet all of the specific details and individual requirements for every usage condition and surrounding of the semiconductor packages.

For example, multichip packages are usually classified into one of three categories according to the number of the allowable channels such as 1-channel packages, 2-channel packages and 4-channel packages, and the multichip packages in each category are manufactured by their own processing steps. That is, the 2-channel packages are manufactured by standard manufacturing lines that are different from those of the 4-channel packages. Therefore, it is difficult in general for the user of the multichip package to modify the 4-channel package into the 2-channel package according to the user's requirements and surroundings of the multichip package.

In the same way, semiconductor packages having a bit organization of x8 is usually difficult to be modified to have a bit organization of x4 according to usage conditions and requirements of individual customers.

For those reasons, customers are obliged to select their semiconductor packages from among standardized semiconductor packages that feature data interconnectors that are as similar to their own usage requirements and surroundings as possible. As a result, most packages are less than optimal for an individual customer's requirements.

SUMMARY

Exemplary embodiments in accordance with principles of inventive concepts include a semiconductor package comprising: a circuit board including a circuit pattern, a plurality of contact pads connected with the circuit pattern and a plurality of contact terminals making contact with an external contact element on a first surface thereof; an integrated circuit (IC) chip structure mounted on the circuit board and electrically connected to the circuit pattern, the IC chip structure having a plurality of memory cell arrays for storing data and a plurality of channel connection pads for transferring data signals to the memory cell arrays; and an operation controller for controlling operation of the semiconductor package, thereby changing an operation mode of the semiconductor package.

Exemplary embodiments in accordance with principles of inventive concepts include a semiconductor package wherein the operation controller includes a channel controller for controlling an electrical connection between the circuit pattern and the channel connection pad.

Exemplary embodiments in accordance with principles of inventive concepts include a semiconductor package wherein the IC chip structure includes first and second dies on each of which memory cell arrays are arranged and the channel controller includes a first selection pad connected to a first channel connection pad of the first die, a second selection pad connected to a second channel connection pad of the second die and a switching unit electrically connecting the first and the second selection pads, so that the IC chip structure is operated in a 1-channel mode, having a single channel, or a 2-channel mode, having a pair of channels, under control of the switching unit.

Exemplary embodiments in accordance with principles of inventive concepts include a semiconductor package wherein the first channel connection pad of the first die includes a plurality of first unit bump pads that are connected to a first group of contact pads on a second surface of the circuit board and the first selection pad includes a plurality of first mirror pads that are connected to the first group of the contact pads through the circuit pattern; the second channel connection pad of the second die includes a plurality of second unit bump pads that are connected to a second group of the contact pads on the second surface of the circuit board and the second selection pad includes a plurality of second mirror pads that are connected to the second group of the contact pads through the circuit pattern and correspond to the first mirror pads one-to-one; and the switching unit individually controls every pair of the corresponding first and second mirror pads to be electrically connected to or disconnected from each other.

Exemplary embodiments in accordance with principles of inventive concepts include a semiconductor package wherein the switching unit includes a plurality of conductive lines interposed between each pair of the corresponding first and second mirror pads.

Exemplary embodiments in accordance with principles of inventive concepts include a semiconductor package wherein the first group of the contact pads is positioned at a side portion of the second surface of the circuit board, the second group of the contact pads is positioned at an opposite portion of the second surface of the circuit board, and the switching unit is positioned at a portion of the second surface of the circuit board between the two side portions of the second surface of the circuit board.

Exemplary embodiments in accordance with principles of inventive concepts include a semiconductor package wherein the IC chip structure further includes a third die that is connected to the first die to thereby function as a first stack die and a fourth die that is connected to the second die to thereby function as a second stack die.

Exemplary embodiments in accordance with principles of inventive concepts include a semiconductor package wherein the channel controller further includes a channel enable unit for selecting an active channel of the IC chip structure from among a plurality of channels and an operation sensing unit for detecting an operation state of the memory cell of the active channel.

Exemplary embodiments in accordance with principles of inventive concepts include a semiconductor package wherein the operation controller includes a bit organization controller for controlling an electrical connection between the circuit pattern and the contact terminal, thereby changing a bit organization structure between the external contact element and the IC chip structure.

Exemplary embodiments in accordance with principles of inventive concepts include a semiconductor package wherein the bit organization controller includes a first selection pad electrically connected to the contact terminals, a second selection pad electrically connected with the channel connection pad of the IC chip structure through the circuit pattern and a switching unit electrically connecting the first and the second selection pads, thereby controlling the number of data transfer lines through which electronic data is transferred to the memory cell arrays from the external contact element.

Exemplary embodiments in accordance with principles of inventive concepts include a semiconductor package wherein the first selection pad includes a plurality of mirror pads each of which is connected to the contact terminals, respectively, through the circuit pattern; the second selection pad includes a plurality of second mirror pads that is connected to a channel connection pad through the circuit pattern and corresponds to the first mirror pads one-to-one; and the switching unit individually controls every pair of the corresponding first and second mirror pads to be electrically connected to or disconnected from each other.

Exemplary embodiments in accordance with principles of inventive concepts include a semiconductor package wherein the electrical connection of the pairs of the first and the second mirror pads are selectively conducted by the switching unit from among a maximum number of data transfer lines, thereby selecting effective data transfer lines between the IC chip structure and the external contact element.

Exemplary embodiments in accordance with principles of inventive concepts include a semiconductor package wherein the effective data transfer lines include one of 4 lines, 8 lines, 16 lines and 32 lines within a maximum number of 32 data transfer lines.

Exemplary embodiments in accordance with principles of inventive concepts include a semiconductor package wherein the IC chip structure includes a flip chip structure.

Exemplary embodiments in accordance with principles of inventive concepts include a semiconductor package wherein the IC chip structure includes at least one of a volatile memory device, a non-volatile memory device or a stack package in which the volatile memory device and the non-volatile memory device are stacked.

Exemplary embodiments in accordance with principles of inventive concepts include a semiconductor package including an electronic circuit connecting a plurality of memory cells; and a channel controller arranged to selectively connect or disconnect memory cells to one another.

Exemplary embodiments in accordance with principles of inventive concepts include a semiconductor package wherein the electronic circuit includes a plurality of semiconductor chips and the channel controller is arranged to selectively connect or disconnect memory cells on one chip to memory cells on another chip.

Exemplary embodiments in accordance with principles of inventive concepts include a semiconductor package wherein the channel controller is arranged to increase a number of channels employed by the memory chips for communication by disconnecting memory cells from one another.

Exemplary embodiments in accordance with principles of inventive concepts include a semiconductor package wherein the channel controller is arranged to disconnect memory cells from one another by a mechanical break in a circuit connection.

Exemplary embodiments in accordance with principles of inventive concepts include a semiconductor package wherein the channel controller is arranged to disconnect memory cells from one another by an electronic break in a circuit connection.

BRIEF DESCRIPTION OF THE DRAWINGS

Exemplary embodiments in accordance with principles of inventive concepts will be more clearly understood from the following detailed description taken in conjunction with the accompanying drawings.

DESCRIPTION

Figure 1:
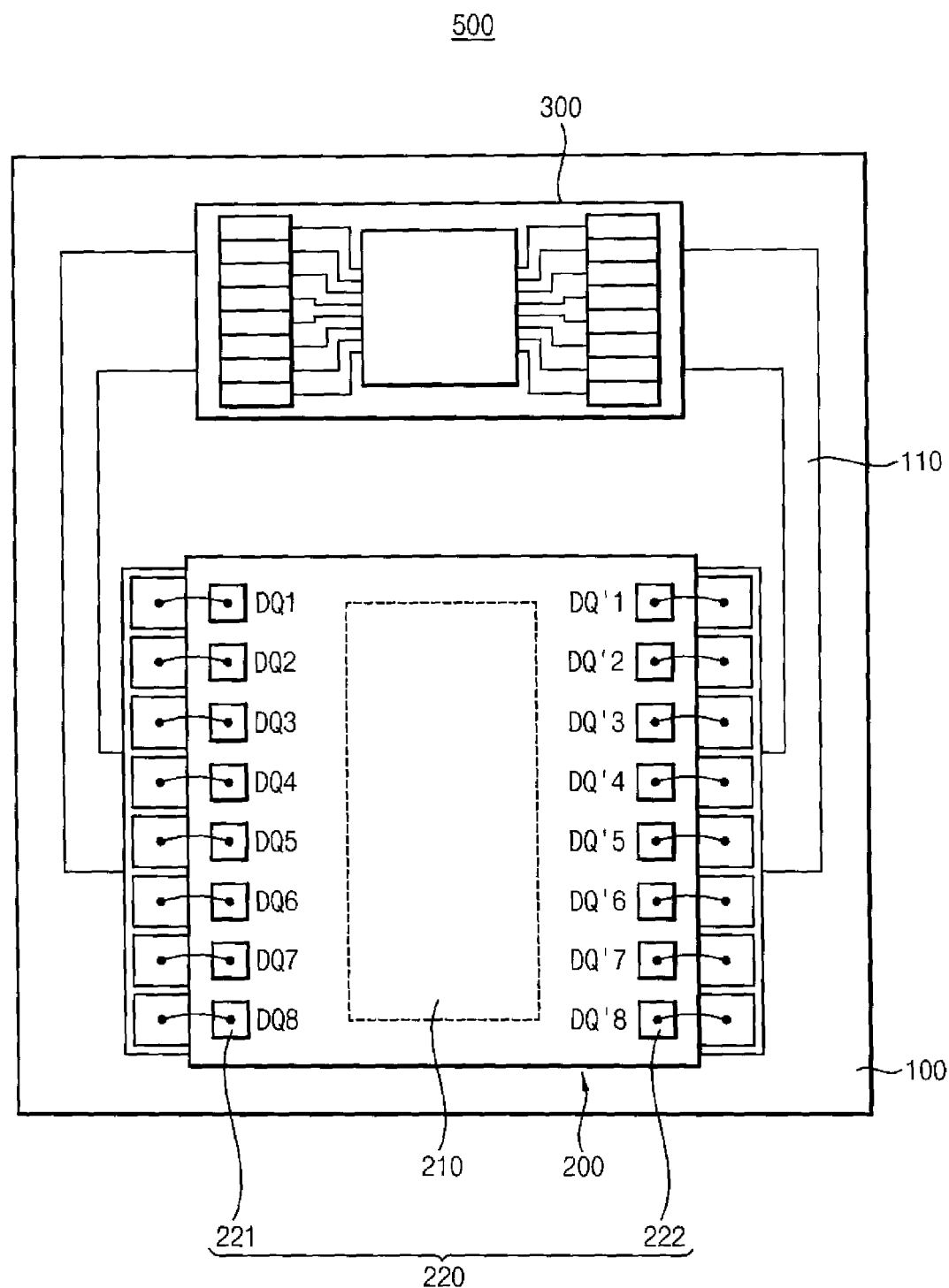
FIG. 1 is a plan view illustrating a semiconductor package in accordance with principles of inventive concepts.

Various exemplary embodiments will be described more fully hereinafter with reference to the accompanying drawings, in which exemplary embodiments are shown. Exemplary embodiments may, however, be embodied in many different forms and should not be construed as limited to exemplary embodiments set forth herein. Rather, these exemplary embodiments are provided so that this disclosure will be thorough, and will convey the scope of exemplary embodiments to those skilled in the art. In the drawings, the sizes and relative sizes of layers and regions may be exaggerated for clarity.

It will be understood that when an element or layer is referred to as being "on," "connected to" or "coupled to" another element or layer, it can be directly on, connected or coupled to the other element or layer or intervening elements or layers may be present. In contrast, when an element is referred to as being "directly on," "directly connected to" or "directly coupled to" another element or layer, there are no intervening elements or layers present. Like numerals refer to like elements throughout. As used herein, the term "and/or" includes any and all combinations of one or more of the associated listed items. The term "or" is used in an inclusive sense unless otherwise indicated.

It will be understood that, although the terms first, second, third, for example. may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of exemplary embodiments.

Spatially relative terms, such as "beneath," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

The terminology used herein is for the purpose of describing particular exemplary embodiments only and is not intended to be limiting of exemplary embodiments. As used herein, the singular forms "a," "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Exemplary embodiments are described herein with reference to cross-sectional illustrations that are schematic illustrations of idealized exemplary embodiments (and intermediate structures). As such, variations from the shapes of the illustrations as a result, for example, of manufacturing techniques and/or tolerances, are to be expected. Thus, exemplary embodiments should not be construed as limited to the particular shapes of regions illustrated herein but are to include deviations in shapes that result, for example, from manufacturing. For example, an implanted region illustrated as a rectangle will, typically, have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the figures are schematic in nature and their shapes are not intended to illustrate the actual shape of a region of a device and are not intended to limit the scope of exemplary embodiments.

Unless otherwise defined, all terms (including technical and scientific terms) used herein have the same meaning as commonly understood by one of ordinary skill in the art to which exemplary embodiments belong. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Hereinafter, exemplary embodiments in accordance with principles of inventive concepts will be explained in detail with reference to the accompanying drawings.

Figure 2:
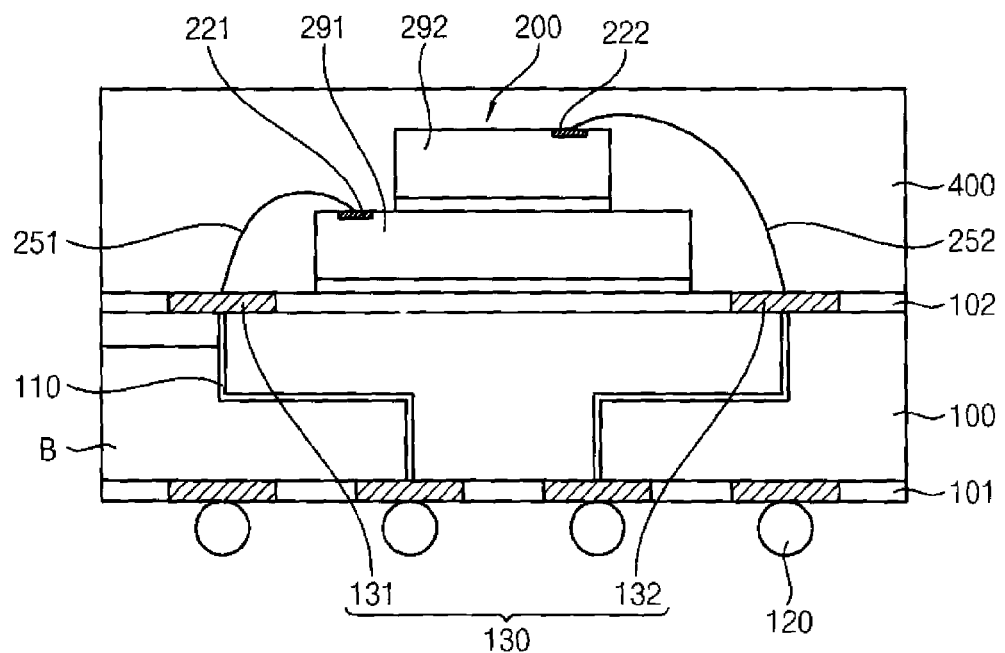
FIG. 2 is a cross-sectional view illustrating the semiconductor package shown in FIG. 1.

FIG. 1 is a plan view illustrating an exemplary embodiment of a semiconductor package in accordance with principles of inventive concepts, and FIG. 2 is a cross-sectional view illustrating the semiconductor package shown in FIG. 1.

Referring to FIGS. 1 and 2, the exemplary embodiment of a semiconductor package 500 in accordance with principles of inventive concepts may include: a circuit board 100 having an inner, or, internal, circuit pattern 110 and a contact terminal 120 connected to the circuit pattern 110 and an external contact element (not illustrated); at least one integrated circuit (IC) chip structure 200 mounted on the circuit board 100 in a configuration in which a plurality of memory cell arrays 210 for storing electronic data (the term "data" is used herein to refer to electronic information, which may include data, commands, etc.) and a plurality of channel connection pads 220 for transferring signals to the memory cell arrays 210 may be arranged; an operation controller 300 connected to the inner circuit pattern 110, the controller 300 for selecting a package operation option, for example; and an encapsulant 400 covering the IC chip structure 200 and the operation controller 300 on the circuit board 100. The encapsulant 400 may include first and second molds 410 and 420.

In an exemplary embodiment in accordance with principles of inventive concepts, the circuit board 100 may include a body B shaped into a plate with a sufficient rigidity. The circuit board 100 may comprise insulating and heat-resistive materials and the inner circuit pattern 110 may be arranged in the body. The inner circuit pattern 110 may include a plurality of conductive lines (not illustrated) and may be connected to a plurality of contact pads 130 arranged on front and rear surfaces of the body B. The contact terminal 120 may be arranged on the contact pad 130 at a rear surface of the body B and the external contact element may make contact with the contact terminal 120. Thus, the external contact terminal may be electrically connected to the inner circuit pattern 110 through the contact terminal 120 and the contact pad 130.

In exemplary embodiments in accordance with principles of inventive concepts, the body B may include a thermosetting plastic plate such as an epoxy resin plate and a polyimide plate. In other exemplary embodiments in accordance with principles of inventive concepts, the body B may include a plate on which a heat-resistive organic film such as a liquid crystal polyester film and a polyamide film may be coated, for example. The inner circuit pattern 110 may include a plurality of conductive lines or wirings that may be electrically connected with the IC chip structure 200 and the external contact element. The circuit pattern 110 may include a power line for applying electric power to the circuit pattern 110, a plurality of signal lines for communicating data signals with the IC chip structure 200 through the circuit pattern 110 and a ground line for providing a ground to the circuit pattern including the signal lines and the power line. The conductive lines or the wirings may be electrically insulated from one another by a plurality of insulation interlayers 101 and 102 that may be arranged on the front and rear surfaces of the body.

A plurality of the contact terminals 120 may be arranged on the rear surface of the body and may be exposed to surroundings in such a way that the inner circuit pattern 110 may be connected to each of the contact terminals 120. Thus, the external contact element making contact with the contact terminal 120 may be connected to the inner circuit pattern 110 via the contact terminal 120.

A plurality of contact pads 130 may be arranged on the front and rear surfaces of the body B and may be electrically separated from one another by the insulation interlayer in such a configuration that an upper portion of the contact pad 120 may be exposed to surroundings. In exemplary embodiments in accordance with principles of inventive concepts, the contact pads 120 include upper pads arranged on the front surface of the body B and lower pads arranged on the rear surface of the body B. The upper pads may make contact with the IC chip structure 200 and thus may function as a bonding finger for connecting the IC chip structure 200 with the circuit board 100. The lower pads may make contact with the contact terminal 120 and thus may function as a bonding pad for connecting the contact terminal 120 with the circuit board 100. The circuit board 100 may include a printed circuit board (PCB) in which the circuit pattern may be printed by a printing process, for example. Hereinafter, the contact pad 130 on the front surface of the body B may be referred to as the bonding finger for convenience sake.

The IC chip structure 200 may include at least one semiconductor device, such as an integrated circuit device, that may be mounted on the circuit board 100. For example, the IC chip structure 200 may include at least a die on which the memory cell arrays 210 for storing electronic data may be arranged and at least a channel connection pad 220 for transferring electrical signals to the memory cells may be provided.

In exemplary embodiments in accordance with principles of inventive concepts, the memory cell arrays 210 may be arranged at a central portion of the die and the channel connection pads 220 may be arranged at a peripheral portion of the die, which may be referred to as edge pad type chip. In other exemplary embodiments in accordance with principles of inventive concepts, the memory cell arrays 210 may also be arranged at the peripheral portion of the die and the channel connection pads 220 may be arranged at the central portion of the die, which may be referred to as central pad type chip.

For example, the memory cell array 210 may include a plurality of word lines and bit lines and a plurality of memory cells intersected with every pair of each word line and each bit line. The memory cells may be classified or be grouped into a memory bank or a memory block. In addition, the memory cell array 210 may include a row decoder, a column decoder and input/output sense amplifier for data communication.

In exemplary embodiments in accordance with principles of inventive concepts memory cell array 210 may function as a minimal unit for an individual channel of the IC chip structure 200. When the IC chip structure 200 may include a single chip structure having a single die such as a wafer level chip scaled package (WLCSP), the channel of the IC chip structure may include a single chip structure. In exemplary embodiments in accordance with principles of inventive concepts in which the IC chip structure 200 may include a plurality of chips having an associated die, such as a multichip package, and the dies may be selectively connected with one another by an interconnector, the memory cell arrays that may be arranged on the interconnected dies may function as a single channel, for example.

The channel connection pads 220 may include various pad structures for conducting data communication with the memory cell array 210. For example, the channel connection pads 220 may include a driving pad for applying driving power for data communication with the memory cell array 210, input buffer pads, logic circuit pads and data input/output (I/O) pads. The I/O pads may include a plurality of unit bumps that may be arranged in a matrix shape along row and column directions. For example, the I/O pads may include data pads for transferring data signals, power pads for applying electrical power to the IC chip structure 200 and address/command pads for receiving address signals and command signals. Electrical power may be applied to the IC chip structure 200 through the power pad. Information on a target memory cell and an operation, such as a command, for example, to the target memory cell may be transferred through the address/command pads. The operation to the target memory cell may include data reading and programming. The electronic data may be transferred to the target memory cell through the data pads.

In exemplary embodiments in accordance with principles of inventive concepts, the IC chip structure 200 may include a first die 291 and a second die 292 that may be stacked on the first die 291. Each of the dies 291 and 292 may include an associated memory cell array 210 thereon. In such exemplary embodiments, each memory cell array on the first and the second dies 291 and 292 may function as a single channel together with each other, or a pair of independent channels, according to the operational selection of the operation controller 300.

Because the term "channel" may refer to an operation unit of the memory cell array that may be independently operated according to an individual channel signal, the channel may include a single memory cell array or a plurality of memory cell arrays, according to the structure of a particular semiconductor package.

The first die 291 may include first channel connection pads 221 that may be connected to the circuit board 100 by first bonding wires 251 and the second die 292 may include second channel connection pads 222 that may be connected to the circuit board 100 by second bonding wires 252.

The first channel connection pads 221 may include first unit bumps DQ1 to DQ8 that may be connected to the circuit board 100 through the first bonding finger 131 and the second channel connection pads 222 may include second unit bumps DQ'1 to DQ'8 that may be connected to the circuit board 100 through the second bonding finger 132.

In exemplary embodiments in accordance with principles of inventive concepts the first and the second dies 291 and 292 may include volatile memory devices such as DRAM devices and non-volatile memory devices such as flash memory devices. In addition, the first and the second dies 291 and 292 may include stack devices in which a DRAM device may be stacked on a flash memory device, for example.

The operation controller 300 may be connected to the circuit pattern 110 of the circuit board 100 and may select an operational option of the semiconductor package 500 according to the package user's choice. The operation controller 300 may be provided on the circuit board 100 and may be electrically connected to the inner circuit pattern 110 by electrical wirings. In exemplary embodiments in accordance with principles of inventive concepts the electrical connection between the circuit pattern 110 and the operation controller 300 may be selectively broken by an electrical member or a mechanical member, and, thus, the package user may select the operational option of the semiconductor package 500.

In accordance with principles of inventive concepts, operation of the semiconductor package 500 may be varied according to operation surroundings and requirements of the semiconductor package 500 under direction of the controller 300 so that the semiconductor package 500 may be operated in an optimal mode. For example, the first and the second dies 291 and 292 may be electrically connected with each other and may be formed into a 1-channel chip in the semiconductor package 500 by operation controller 300. In other exemplary embodiments in accordance with principles of inventive concepts, the first and the second dies 291 and 292 may be electrically independent from each other and may therefore be formed into a 2-channel chip in the semiconductor package 500 by operation controller 300. In addition, the operation controller 300 may selectively activate the contact terminals and may thereby vary a data transfer structure according to a package user's needs.

In exemplary embodiments in accordance with principles of inventive concepts, the operation controller 300 may include a channel controller for selecting the channel type of the IC chip structure 200 and a bit organization controller for selecting the data transfer structure with the external contact element. In exemplary embodiments in accordance with principles of inventive concepts other controllers may be included in the operation controller 300 as well as the channel controller and the bit organization controller, as long as the other controllers do not deteriorate the performance and structure of the semiconductor package 500. The semiconductor package 500 may include other operational options for the optimal operation thereof.

In exemplary embodiments in accordance with principles of inventive concepts the operation controller 300 may be provided on the circuit board 100 and may be connected to the inner circuit pattern 110 by the electrical wirings. However, the operation controller 300 may be provided at other locations, so long as the operation controller 300 may be electrically connected with the inner circuit pattern 110. For example, the operation controller 300 may be separated from the circuit board 100 and the IC chip structure 200 and may be positioned at locations apart from the circuit board 100 and the IC chip structure 200 when the operation controller 300 is wirelessly connected to the circuit pattern 110.

Figure 3:
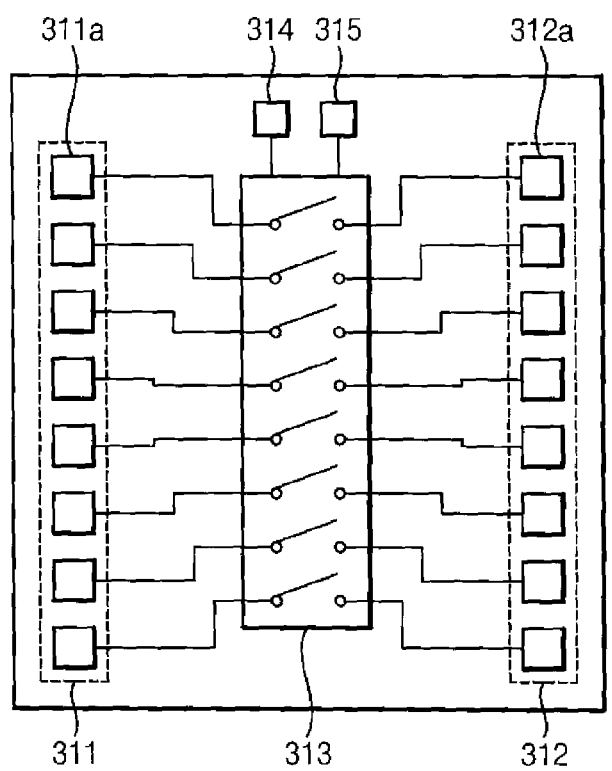
FIG. 3 is a plan view illustrating a first example embodiment of the operation controller of the semiconductor package shown in FIG. 1.

FIG. 3 is a plan view illustrating a first exemplary embodiment of an operation controller in accordance with principles of inventive concepts, such as that of the semiconductor package shown in FIG. 1.

Referring to FIG. 3, operation controller 300 may include a channel controller 310 for controlling the electrical connection between the inner circuit pattern 110 and the first and the second channel connection pads 221 and 222.

For example, the channel controller 310 may include a first selection pad 311 electrically connected to the first channel connection pad 221, a second selection pad 312 electrically connected to the second channel connection pad 222 and a switching unit 313 for selectively connecting the first and the second selection pads 311 and 312. In an exemplary embodiment, when the first selection pad 311 is electrically connected to the second selection pad 312 by the switching unit 313, the IC chip structure 200 may be operated as a 1-channel chip and when the first selection pad 311 is electrically disconnected with the second selection pad 312 by the switching unit 313, the IC chip structure 200 is operated as a 2-channel chip.

In an exemplary embodiment in accordance with principles of inventive concepts, the first channel connection pad 221 may include a plurality of the first unit bump pads DQ1 to DQ8 for data transfer and the first selection pad 311 may include a plurality of first mirror pads 311a. The first unit bump pads DQ1 to DQ8 of the first channel connection pad 221 may be individually connected to the first bonding fingers 131 of the circuit board 100, respectively, and the first bonding fingers 131 may be individually connected to the first mirror pads 311a, respectively, through the circuit pattern 110. Thus, the first unit bump pads DQ1 to DQ8 may be individually connected to the first mirror pads 311a, respectively.

In the same manner, the second channel connection pad 222 may include a plurality of the second unit bump pads DQ'1 to DQ'8 for data transfer and the second selection pad 312 may include a plurality of second mirror pads 312a. The second unit bump pads DQ'1 to DQ'8 of the second channel connection pad 222 may be individually connected to the second bonding fingers 132 of the circuit board 100, respectively, and the second bonding fingers 132 may be individually connected to the second mirror pads 312a, respectively, through the circuit pattern 110. Thus, the second unit bump pads DQ'1 to DQ'8 may be individually connected to the second mirror pads 312a, respectively.

While the first and the second channel connection pads 221 and 222 may be disclosed to have eight unit bump pads in the above example embodiment, the number of the unit bump pads may be varied according to the performance and structure of the IC chip structure 200. For example, the first and the second channel connection pads of the IC chip structure 200 may be modified to have 16 or 32 unit bump pads, thereby increasing the speed of the data transfer of the IC chip structure 200.

In the present exemplary embodiment in accordance with principles of inventive concepts, the channel controller 310 may be provided on an upper surface of the circuit board 100. In accordance with principles of inventive concepts, first bonding 131 and second bonding fingers 132 may be positioned on opposite sides of the circuit board 100. For example, the first bonding fingers 131 may be arranged on a right portion of the upper surface of the circuit board 100 and the second bonding fingers 132 may be arranged on a left portion of the upper surface of the circuit board 100. The channel controller 310 may be arranged on a central portion of the upper surface of the circuit board 100. Thus, in this exemplary embodiment, the first selection pad 311 may be connected to the first bonding fingers 131 toward the right portion of the circuit board 100 and the second selection pad 312 may be connected to the second bonding fingers 132 toward the left portion of the circuit board 100 through the inner circuit pattern 110 on the upper surface of the circuit board 100. Then, the first and the second selection pads 311 and 312 may be selectively connected with each other by the switching unit 313 on the upper surface of the circuit board 100.

Although not illustrated in figures, the channel controller 310 may be provided on a side surface or on a lower surface of the circuit board 100 as well as the upper surface of the circuit board 100. In addition, an additional board (not shown) may be provided aside the circuit board 100 and the channel controller 310 may be arranged on the additional board. In such a case, the channel controller 310 may be connected to the inner circuit pattern 110 through re-directional lines.

The switching unit 313 may control the electrical connection between a pair of the corresponding first and second mirror pads 311a and 312a. Thus, the first mirror pads 311a may be selectively connected to or disconnected from the second mirror pads 312a, respectively, by the switching unit 313.

For example, the switching unit 313 may include a plurality of conductive lines each of which may connect the corresponding first and second mirror pads 311a and 312a, respectively. Each conductive line may connect a pair of the corresponding first and second mirror pads 311a and 312a, and thus the first and the second selection pads 311 and 312 may be connected to each other when all of the mirror pads 311a may be connected to the corresponding second mirror pads by the conductive lines, respectively. When the conductive line may be connected to both of the corresponding first and second mirror pads 311a and 312a, the first and the second selection pads 311 and 312 may be connected and thus the first and the second channel connection pads 221 and 222 may be connected to each other. That is, the first and the second dies 291 and 292 may be electrically connected to each other, and the IC chip structure 200 may be operated as a 1-channel mode.

In exemplary embodiments in accordance with principles of inventive concepts in which the conductive lines are broken between the first and the mirror pads 311a and 312a, the first selection pad 311 may be electrically isolated from the second selection pad 312, and thus the first and the second channel connection pads 221 and 222 may be electrically independent from each other. That is, the first and the second dies 291 and 292 may be electrically independent from each other, and the IC chip structure 200 may be operated in a 2-channel mode.

In accordance with principles of inventive concepts, the conductive line may be selectively broken in various manners. For example, a laser beam may be irradiated to each of the conductive lines, to thereby mechanically cut off (that is, open) the conductive lines of the switching unit 313, or an electronic fuse may have a sufficient current run through it to open the connection, for example. At first (that is, for example, when a user receives the package 500), all of the conductive lines of the switching unit 313 may be connected between the first and the second unit bump pads 311a and 312a in manufacturing the semiconductor package 500. When the package user operates the semiconductor package 500 in a 1-channel mode, the semiconductor package 500 may be used without opening the conductive lines by irradiation of the laser beam to the switching unit 313. In applications where the package user desires a 2-channel mode package, the semiconductor package 500 may be modified to operate in a 2-channel mode by irradiating the laser beam to the conductive lines and mechanically opening the conductive lines. When the conductive lines of the switching unit 313 are cut off between the first and the second mirror pads 311a and 312a, the first and the second channel connection pads 221 and 222 will be electrically independent from each other and thus the first and the second dies 291 and 292 will be electrically independent from each other. As a result, the IC chip structure 200 may be operated in a 2-channel mode.

In another exemplary embodiment in accordance with principles of inventive concepts, the conductive lines may be modified to be selectively connected or disconnected by a switch, such as a toggle switch (not shown). The toggle switch may be positioned on each of the conductive lines and thus each conductive line may be interchanged between a connection state and a broken state by the toggle switch. That is, the first and the second mirror pads 311a and 312a may be electrically connected by the operation of the toggle switch. Thus, the first and the second dies 291 and 292 may be selectively connected to or disconnected from each other by the toggle switch.

In another exemplary embodiment in accordance with principles of inventive concepts, the channel controller 310 may include a channel enable unit 314 for selecting an active channel from two or more channels and an operation sensing unit 315 for detecting the state of the operation, e.g., a reading state or a writing or programming state, of the memory cells in the active channel.

The channel enable unit 314 may generate a channel enable signal for selecting an active channel from the channels of the IC chip structure 200. For example, when the IC chip structure 200 is controlled to operate as the 2-channel mode by the switching unit 313, one of the two channels may be enabled as the active channel by the channel enable unit 314. In addition, the initial operation to the memory cell of the active channel may be selected between the reading operation and the programming operation according to the package user's choice by the operation sensing unit 315.

The channel enable unit 314 and the operation sensing unit 315 may be electrically connected to the toggle switch, and thus the active channel and the initial operation of the memory cell in the active channel may be selected at a time when the first and the second mirror pads 311a and 312a may be connected by the conductive lines.

The IC chip structure 200 and the operation controller 300 may be covered with the encapsulant 400 and thus may be protected from external disturbances. For example, the encapsulant 400 may include an epoxy molding compound (EMC) resin. In exemplary embodiments in accordance with principles of inventive concepts, the encapsulant 400 may be selectively provided on the circuit board 100, and thus the operation controller 300 may be left uncovered by the encapsulant 400. A recess (not shown) may be prepared on the circuit board 100 and the switching unit 313 may be arranged in the recess without the encapsulant 400. That is, the switching unit 313 in the recess may be open when operating the semiconductor package 500. In this manner, when the package user desires to change the channel mode of the semiconductor package 500, the switching unit 313 in the recess may be directly controlled by the package user, thereby controlling the electrical connection between the first selection pad 311 and the second selection pad 312.

In other exemplary embodiments in accordance with principles of inventive concepts, the operation controller 300 in the recess may be closed by a door (not shown) so as to separate the operation controller 300 from surroundings and when a package user desires to change the channel mode of the semiconductor package 500, the door may be opened and the operation controller 300 in the recess may be controlled in the same way as described above. Thus, the operation controller 300 may be protected from surroundings in operating the semiconductor package 500.

Although exemplary embodiments disclosed thus-far indicate that the IC chip structure 200 may include the first and the second dies 291 and 292 and thus the operation channel of the semiconductor package 500 may be interchanged between a 1-channel mode and a 2-channel mode, any other operation channel may also be provided to the semiconductor package 500 by modifying the structure of the memory cell array and the number of the stacked dies.

Figure 4A:
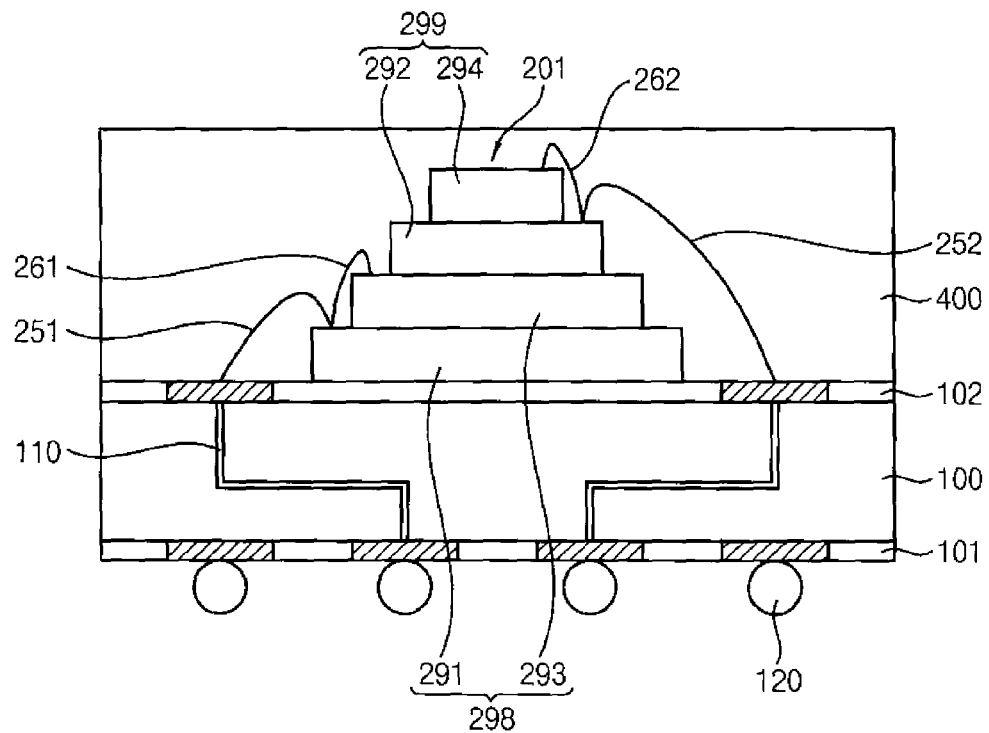
FIG. 4A is a cross-sectional view illustrating a first modification of the semiconductor package shown in FIG. 1.
Figure 4B:
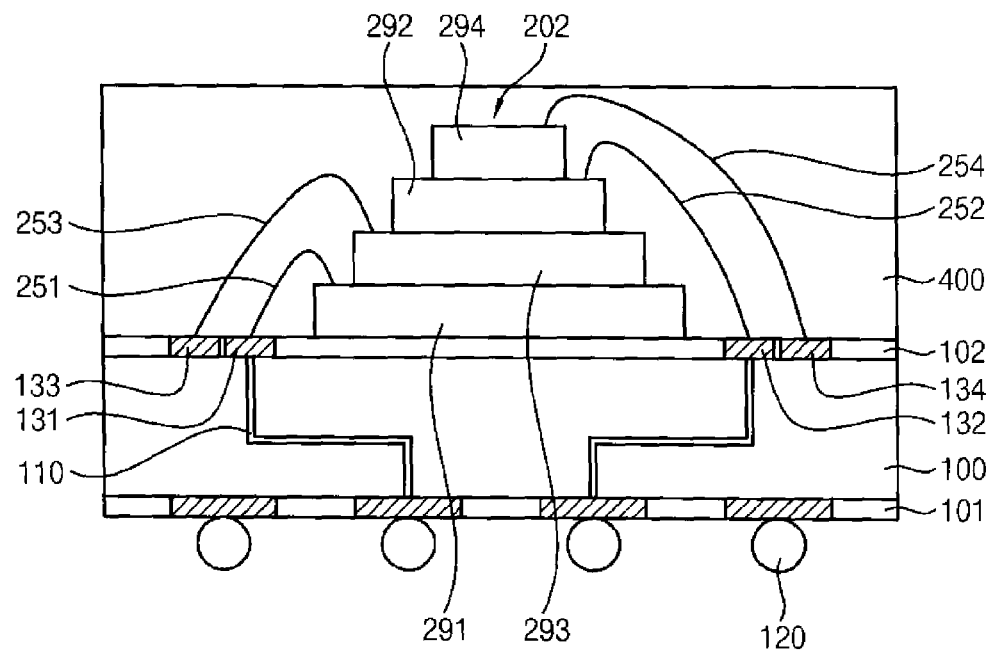
FIG. 4B is a cross-sectional view illustrating a second modification of the semiconductor package shown in FIG. 1 in accordance with principles of inventive concepts.

FIG. 4A is a cross-sectional view of an exemplary embodiment in accordance with principles of inventive concepts which will be referred to herein as a first modification of the semiconductor package shown in FIG. 1. FIG. 4B is a cross-sectional view of an exemplary embodiment in accordance with principles of inventive concepts which will be referred to herein as a second modification of the semiconductor package shown in FIG. 1. In FIGS. 4A and 4B, the modified semiconductor packages have substantially the same structures as the semiconductor package shown in FIGS. 1 to 3 except for the IC chip, and thus the same reference numerals denote the same elements in FIGS. 1 to 3 and for clarity and convenience of description, the detailed descriptions on the same elements will not be repeated.

Referring to FIG. 4A, in accordance with principles of inventive concepts a first modification 501 of the semiconductor package shown in FIG. 1 may include a first modified IC chip structure 201. The first modified IC chip structure 201 may be mounted on the circuit board 100 and may further include a third die 293 connected to the first die 291 and a fourth die 294 connected to the second die 292.

The third die 293 may be stacked on the first die 291 and the first and the third dies 291 and 293 may be connected with each other by a first additional bonding wire 261. The second die 292 may be stacked on the third die 293 and the fourth die 294 may be stacked on the second die 292. The second die 292 and the fourth die 294 may be connected with each other by a second additional bonding wire 262. Thus, in this exemplary embodiment, the first and the third dies 291 and 293 may be bonded into a first stack die 298 and the second and the fourth dies 292 and 294 may be bonded into a second stack die 299. Various interconnectors, such as penetration electrodes, may be used in place of the first and the second additional bonding wires 261 and 262, for example.

In accordance with principles of inventive concepts, when the first and the second selection pads 311 and 312 are connected to each other by the switching unit 313, the first and the second stack dies 298 and 299 may also be connected to each other and thus the first modification 501 of the semiconductor package may be operated in a 1-channel mode. When the first and the second selection pads 311 and 312 are separated from each other by the switching unit 313, the first and the second stack dies 298 and 299 may also be electrically separated from each other and thus the first modification 501 of the semiconductor package may be operated in a 2-channel mode. Accordingly, the memory capacity may be increased at each channel mode of the first modification 501 of the semiconductor package in accordance with principles of inventive concepts.

Referring to FIG. 4B, a second modification 502 of the semiconductor package shown in FIG. 1 may include a second modified IC chip structure 202. The second modified IC chip structure 202 may be mounted on the circuit board 100 and may include a third die 293 connected to the circuit board 100 by a third bonding wire 253 and a fourth die 294 connected to the circuit board 100 by a fourth bonding wire 254. That is, in this exemplary embodiment, the first and the second dies 291 and 292 may be connected to the first and the second bonding fingers 131 and 132, respectively, and the third and the fourth dies 293 and 294 may be connected to third and fourth bonding fingers 133 and 134, respectively, that may be arranged at areas of the circuit board 100 different from those of the first and the second bonding fingers 131 and 132. For example, when the first and the second bonding fingers 131 and 132 are arranged at right and left portions of the upper surface of the circuit board 100, respectively, the third and the fourth bonding fingers 133 and 134 may be arranged at upper and lower portions of the upper surface of the circuit board 100, respectively.

In such exemplary embodiments, the channel controller 310 may further include third and fourth selection pads (not shown) electrically connected with the third and the fourth bonding fingers 133 and 134, respectively, as well as the first and the second selection pads 311 and 312. The first selection pad 311 may be electrically connected to the third selection pad and the second selection pad 312 may be electrically connected to the fourth selection pad, for example. In addition, a second switching unit (not shown) may be further provided for controlling the electrical connection between the first and the third selection pads. In the same way, a third switching unit (not shown) may be further provided for controlling the electrical connection between the second and the fourth selection pads.

Accordingly, the second modification 502 of the semiconductor package may be operated in a 1-channel mode, a 2-channel mode, a 3-channel mode or a 4-channel mode by the combination of the first to third switching units.

The operation controller 300 may include a bit organization controller for controlling the data transfer between the external contact element and the IC chip structure 200.

Figure 5:
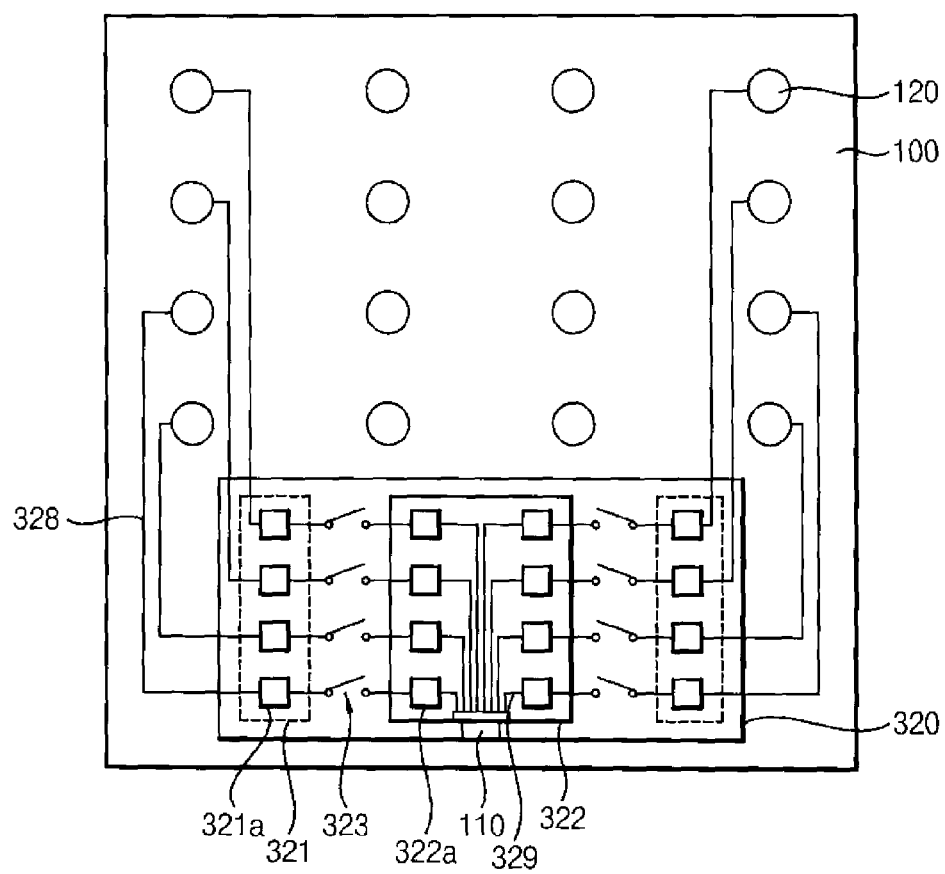
FIG. 5 is a rear view illustrating a semiconductor package in accordance with another example embodiment in accordance with principles of inventive concepts.

FIG. 5 is a rear view illustrating another exemplary embodiment of a semiconductor package in accordance with principles of inventive concepts. In FIG. 5, the semiconductor package 600 may have substantially the same structures as the semiconductor package 500 shown in FIGS. 1 and 2 except for the operation controller, and thus the same reference numerals denote the same elements in FIGS. 1 to 2 and, for clarity and convenience of description, detailed descriptions of the same elements will not be repeated. The bit organization controller may be provided as the operation controller in place of the channel controller.

Referring to FIG. 5, a semiconductor package 600 may include a bit organization controller 320. The bit organization controller 320 may control the electrical connection between the inner circuit pattern 110 and the contact terminal 120. In this manner, the number of the data transfer lines between the external contact element and the IC chip structure 200 may be controlled by the bit organization controller 320.

The IC chip structure 200 may be connected to the inner circuit pattern 110 through the first and the second bonding fingers 131 and 132 and the circuit pattern 110 may be electrically connected to the contact terminal 120 through the contact pad 130 at the rear surface of the body of the circuit board 100. Thus, the external contact element may be electrically connected to the IC chip structure 200 through the contact terminal 120 and the inner circuit pattern 110. In such a case, the electrical connection between the inner circuit pattern 110 and the contact terminal 120 may be controlled by the bit organization controller 320.

For example, the bit organization controller 320 may include a first selection pad 321 connected to the contact terminal 120, a second selection pad 322 electrically connected to the channel connection pad 220 of the IC chip structure 200 through the circuit pattern 110 and a switching unit 323 selectively connecting the first and the second selection pads 321 and 322. The number of data transfer lines between the IC chip structure 200 and the external contact element in the semiconductor package 600 may be controlled by the bit organization controller 320.

In exemplary embodiments in accordance with principles of inventive concepts, the first selection pad 321 may include a plurality of first mirror pads 321a that may be connected to the contact terminals 120, respectively, through the circuit pattern 110. The second selection pad 322 may include a plurality of second mirror pads 322a corresponding to the first mirror pads 321a, respectively. The channel connection pad 220 may include a plurality of the unit bump pads for data transfer and the second mirror pads 322a may be electrically connected to the unit bump pads, respectively, through the circuit pattern 110 and the bonding finger. Thus, the second selection pad 322 may be electrically connected to the channel connection pad 220 via the circuit pattern 110 and the bonding finger 130. In accordance with principles of inventive concepts, the switching unit 323 may control the electrical connection between every pair of the corresponding first and second mirror pads 321a and 322a.

The contact terminals 120 may be connected with the first mirror pads 321a in a maximal bit organization structure according to the technical requirements of the semiconductor package 600. In exemplary embodiments in accordance with principles of inventive concepts, eight contact terminals 120 may be connected to eight first mirror patterns 321a, respectively, through a first conductive line 328 and thus an 8-bit organization may be provided as a data transfer unit between the contact terminal 120 and the first selection pad 321. The first mirror pads 321a may be arranged along a single line on the circuit board 100 as illustrated in FIG. 3 or at both sides of the second selection pad 322 as illustrated in FIG. 5, for example.

The first mirror pads 321a may have a one-to-one correspondence with the second mirror pads 322a, and each pair of the corresponding first and second mirror pads 321a and 322a may be individually connected to or disconnected from each other by the switching unit 323. In exemplary embodiments in accordance with principles of inventive concepts, 8 pairs of the first and second mirror pads 321a and 322a may be provided as the bit organization structure. The second mirror pads 322a may be connected to the circuit pattern 110 via second conductive lines 329 and thus may be connected to the channel connection pad 220 of the IC chip structure 200.

When the pair of the corresponding first and second mirror pads 321a and 322a are connected by the switching unit 323, the electronic data transferred from the external contact element may be transferred to the channel connection pad 220 through the contact terminal 120, the first selection pad 321 and the second selection pad 322. Then, the electronic data may be transferred to the memory cell array 210 through the unit bump pads of the channel connection pad 220.

When some of the 8-pair of the first and second mirror pads 321a and 322a are electrically disconnected from each other by the switching unit 323, the remaining pairs of the first and second mirror pads 321a and 322a may be still connected with each other and may function as effective data transfer lines in the semiconductor package 600. That is, in accordance with principles of inventive concepts, the bit organization structure of the semiconductor package 600 may be modified by the switching unit 323 according to the package user's choice. In exemplary embodiments in accordance with principles of inventive concepts, the number of data transfer lines may be varied by the switching unit 323. The switching unit 323 may include 8 conductive lines interposed between each pair of the first and second mirror pads 321a and 322a, and some of the conductive lines may be opened by the package user. For example, when 4 conductive lines among the 8 conductive lines are opened by the switching unit 323, the remaining 4 closed conductive lines may function as the effective data transfer lines. In this manner in accordance with principles of inventive concepts, the bit organization structure may be efficiently changed into a 4-data transfer line structure from an 8-data transfer line structure by the switching unit 323.

The semiconductor package 600 may be manufactured in accordance with principles of inventive concepts so that the IC chip structure 200 may be connected to the external contact element on the circuit board 100 under maximal data transfer lines. Then, some pairs of the first and second mirror pads 321a and 322a may be selectively opened by the switching unit 323 according to the package user's choice and the package usage requirements. That is, in accordance with principles of inventive concepts the bit organization structure, including the number of the data transfer lines, may be individually modified by the package user.

Accordingly, the bit organization structure may be modified or varied within the maximal value of the data transfer lines. That is, in accordance with principles of inventive concepts, any number of data transfer lines, up to and including the maximum number, may be selected for use by a package user. The bit organization structure of the semiconductor package 600 may be changed into the effective 4 data transfer lines from the maximal 8 data transfer lines by the bit organization controller 320. However, any other effective data transfer lines may be obtained in case that the maximal data transfer lines may be changed. For example, when the semiconductor package 600 may be manufactured to have 32 data transfer lines as the maximal number of the data transfer lines, 4 data transfer lines, 8 data transfer lines, 16 data transfer lines or 32 data transfer lines may be selected as the effective number of data lines from the maximal 32 data transfer lines by the bit organization controller 320 as an operational bit organization structure of the semiconductor package 600.

The first and the second selection pads 321 and 322 and the switching unit 323 of the bit organization controller 320 may have substantially the same configurations and structures as first and the second selection pads 311 and 312 and the switching unit 313 of the channel controller 310. Therefore, the switching unit 323 may include conductive lines for connecting the corresponding first and second mirror pads 321a and 322a or may include toggle switches for selectively short the electrical connection between the corresponding first and second mirror pads 321a and 322a, for example. When the switching unit 320 includes the conductive lines, some of the conductive lines may be selectively cut off, broken, or, generally, opened using, for example, a laser beam. In this manner, some of the first and the second mirror pads 321a and 322a may be electrically connected to each other and the remainder of the first and the second mirror pads 321a and 322a may be electrically separated from each other, which may vary the data transfer structure of the semiconductor package 600. When the switching unit 320 includes a switch, such as a toggle switch, each pair of the corresponding first and second mirror pads 321a and 322a may be electrically connected or disconnected by the toggle switch with relative ease.

Although, in this exemplary embodiment, the bit organization controller 320 may be provided on a lower surface of the circuit board 100, the bit organization controller 320 may be provided at other locations, as long as the electrical connection between the contact terminal 120 and the channel connection pad 220 may be sufficiently controlled.

In addition, both of the channel controller 310 and the bit organization controller 320 may be provided on the circuit board 100, and, as a result, the active channel and the bit organization structure for communicating data with the active channel may be conveniently controlled and selected by the package user.

Because the bit organization controller 320 may be provided just for the control on the electrical connection between the contact terminal 120 and the inner circuit pattern 110, the IC chip structure 200 may be mounted on the circuit board 100 in various configurations and structures.

In exemplary embodiments in accordance with principles of inventive concepts, the IC chip structure 200 may be mounted on the circuit board 100 as a flip chip structure.

Figure 6A:
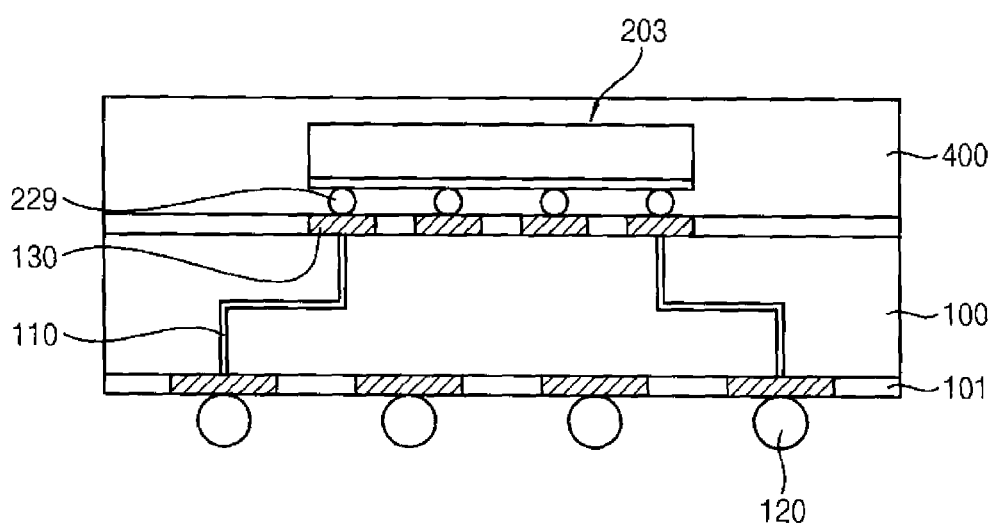
FIG. 6A is a cross-sectional view illustrating a modification of the semiconductor package shown in FIG. 5.
Figure 6B:
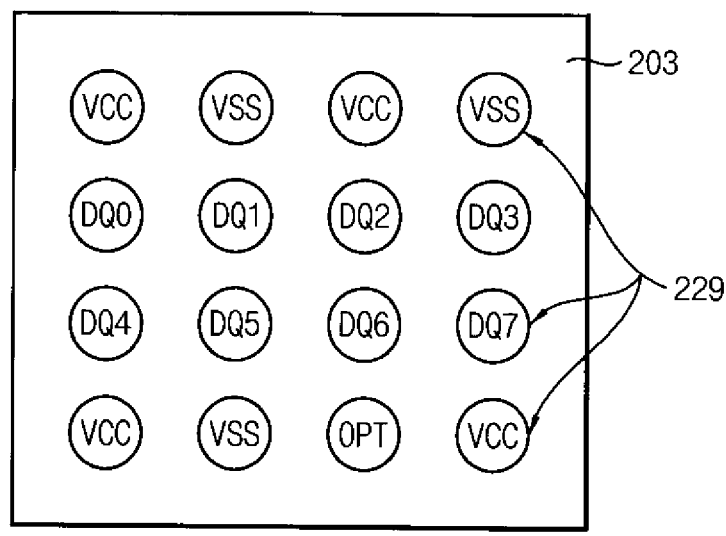
FIG. 6B is a view illustrating the channel connection pads of the IC chip structure shown in FIG. 6A.

FIG. 6A is a cross-sectional view of an exemplary embodiment in accordance with principles of inventive concepts, referred to herein as a modification of the semiconductor package shown in FIG. 5 and FIG. 6B is a view illustrating the channel connection pads of the IC chip structure shown in FIG. 6A. In FIG. 6A, the modified semiconductor package has substantially the same structures as the semiconductor package shown in FIGS. 2 and 5 except for the IC chip, and thus the same reference numerals denote the same elements as in FIGS. 2 and 5 and, for clarity and convenience, detailed descriptions thereof will not be repeated here.

Referring to FIGS. 6A and 6B, a semiconductor package 601 may include a third modified IC chip structure 203. The third modified IC chip structure 203 may include a flip chip structure that may be mounted on the circuit board 100 through a plurality of solder bumps 229. The solder bumps 229 may make contact with the contact pad 130 on the upper surface of the circuit board 100 and thus may be connected to the circuit pattern 110. Because the contact terminal 120 may be connected to the circuit pattern 110, the solder bump 229 may be electrically connected to the contact terminal 120. The third modified IC chip structure 203 may include a volatile memory device such as a DRAM device, a non-volatile memory device such as a flash memory device or a stack structure in which the volatile and the non-volatile memory devices may be stacked.

Solder bumps 229 may correspond to the channel connection pad 220 and may comprise conductive materials, and thus the third modified IC chip structure 203 may be electrically connected to the circuit board 100 through the solder bumps 229. Additionally, the solder bumps 229 may be bonded to the circuit board 100 by a soldering process and thus the third modified IC chip structure 203 may be stably fixed to the circuit board 100.

When the third modified IC chip structure 203 includes the DRAM devices, the solder bumps 229 may include a plurality of power bump pads VCC and VSS and a plurality of data bump pads DQ0 to DQ7, as shown in FIG. 6B, for example.

The power and data bump pads of the solder bump 229 may be electrically connected to the second mirror pads 322a of the second selection pad 322 via the circuit pattern 110 and the second mirror pads 322a may be selectively connected to the corresponding first mirror pads 321a of the first selection pad 321 by the switching unit 323. The first mirror pads 321a may be individually connected to the contact terminals 120 on the lower surface of the circuit board 100. Therefore, the bit organization controller 320 may control and select the data transfer structure of the modified semiconductor package 601.

Figure 7:
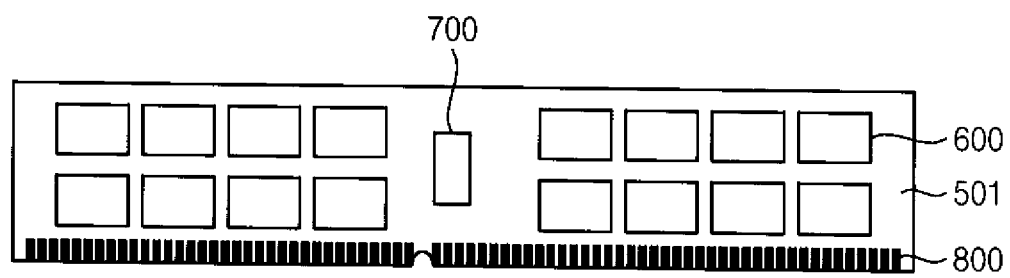
FIG. 7 is a plan view illustrating a semiconductor module having the semiconductor package shown in FIG. 5 in accordance in accordance with principles of inventive concepts.

FIG. 7 is a plan view illustrating an exemplary embodiment of a semiconductor module 1000 including a semiconductor package in accordance with principles of inventive concepts, such as the semiconductor package shown in FIG. 5.

Referring to FIG. 7, the semiconductor module 1000 in accordance with principles of inventive concepts may include a module substrate 501, a plurality of semiconductor packages 600 arranged on the module substrate 501, a control chip unit 700 for operating the semiconductor packages 600 and a plurality of input/output (I/O) pins 800. The semiconductor packages 600 and the control chip unit 700 may be electrically connected in series or in parallel with the I/O pins 800.

In an exemplary embodiment in accordance with principles of inventive concepts, the semiconductor package 600 may have substantially the same structures as the semiconductor package described in detail with reference to FIG. 5. Thus, the semiconductor package 600 may include the IC chip structure 200 and bit organization controller 320 that may be arranged on the circuit board 100. The contact terminal 120 of the semiconductor package 600 may contact with the module board 501. The control chip unit 700 may include a plurality of logic chips for controlling the operation of the semiconductor packages 600 on the board substrate 501.

The bit organization controller 320 may be provided at each semiconductor package 600, and thus the bit organization structure, such as the data transfer structure, may be individually controlled and selected at each semiconductor package 600 by the respective bit organization controller 320. In other exemplary embodiments in accordance with principles of inventive concepts, a central controller (not shown) may be provided in the control chip unit 700 and the bit organization controllers 320 at each semiconductor package 600 may be connected to the central controller. In such exemplary embodiments, the control on the bit organization structure of each semiconductor package 600 may be conducted together with the operation control on the semiconductor package 600.

In accordance with principles of inventive concepts, the bit organization between the I/O pins 800 and the semiconductor packages 600 may be controlled and changed by the bit organization controller 320 in the semiconductor module 1000 according to the module user's choice and requirements of the semiconductor module 1000.

Although is exemplary embodiment indicates that the semiconductor module 1000 may include the semiconductor package shown in FIG. 5, other exemplary embodiments may include semiconductor packages such as those shown in FIGS. 1, 4A and 4B. In such embodiments, the active channel of the semiconductor packages 600 may be controlled and changed in the semiconductor module 1000 by the channel controller 310 according to the module user's choice and requirements of the semiconductor module 1000.

Figure 8:
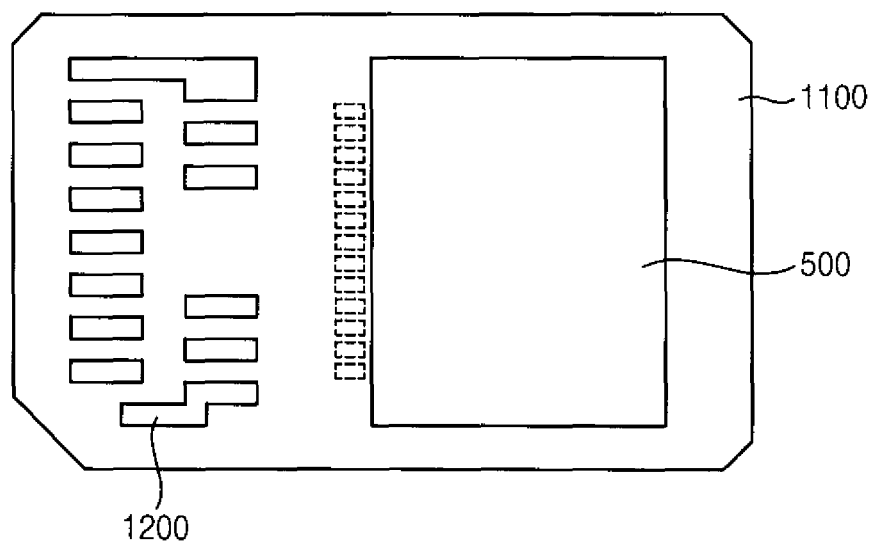
FIG. 8 is a plan view illustrating an electronic system having the semiconductor package shown in FIG. 1 in accordance with principles of inventive concepts.

FIG. 8 is a plan view illustrating an electronic system in accordance with principles of inventive concepts that includes a semiconductor package in accordance with principles of inventive concepts, such as that shown in FIG. 1. In FIG. 8, a memory card including the semiconductor package 500 shown in FIG. 1 may be exemplarily disclosed as the electronic system. However, the electronic system may include various other memory-chip applied systems including the semiconductor package 500. In addition, the electronic system may also include one of the semiconductor package shown in FIGS. 3, 4A, 4B, 5 and 6A, for example.

Referring to FIG. 8, an electronic system 2000 in accordance with an example embodiment of the present inventive concept may include a system board 1100, at least one semiconductor package 500 arranged on the system board 1100 and an I/O pin unit 1200 for transferring electronic data.

The semiconductor package 500 in the electronic system 2000 may have substantially the same structures as the semiconductor package described with reference to FIGS. 1 to 3. As a result, the semiconductor package 500 may include the IC chip structure 200 and the channel controller 310 for enabling an active channel of the IC chip structure 200. The contact terminal 120 of the semiconductor package 500 may make contact with and may be bonded to the system board 1100. Thus, the semiconductor package 500 may be connected to system wiring lines in the system board 1100.

The IC chip structure 200 may include a DRAM device and/or a flash memory device and may communicate with surroundings through the I/O pin unit 1200. Thus, a peripheral system such as a supplemental storage and a display terminal may be communicated with IC chip structure 200 through the I/O pin unit 1200. In such an exemplary embodiment, a latent channel may be selected as an active channel of the IC chip structure of each semiconductor package 500 by manipulating the channel controller 310 according to the system user's needs.

In exemplary embodiments in accordance with principles of inventive concepts, the channel combination of the IC chip structure 200 of the semiconductor packages 500 may be controlled and changed by the channel controller 310 in the electronic system 2000 according to the system user's choice and requirements of the electronic system 2000.

For example, when the requirements of the electronic system 2000 change, the active channel of the IC chip structure of the semiconductor package 500 may be changed according to the system user's needs (that is, for example, to accommodate changes in the system requirements), thereby improving the flexibility and applicability of the electronic system 2000 to surroundings or usage conditions. Although not shown in figures, the bit organization controller 320 may also be provided on the semiconductor package 500 together with the channel controller 310, and thus both of the active channel and the bit organization structure may be controlled and selected according to the individual usage requirements of the electronic system 2000.

According to exemplary embodiments in accordance with principles of inventive concepts of the semiconductor package and the semiconductor module and electronic system including the same, various operation options of the semiconductor package, such as the number of the channels and the data transfer lines, may be controlled and selected by manipulating the operation controller, and thus the semiconductor package may satisfy various customers' needs and usage conditions. Thus, although the usage conditions and requirements of the semiconductor package and the electronic system including the semiconductor package may be varied, the semiconductor package may also be used for varied usage conditions in optimal operation states by changing and selecting the operation options of the semiconductor package.

The exemplary embodiments of a memory device in accordance with principles of inventive concepts may be applied to various electronic systems including semiconductor devices and IC chips such as telecommunication systems and storage systems, for example.

The foregoing is illustrative of example embodiments and is not to be construed as limiting thereto. Although exemplary embodiments have been described, those skilled in the art will readily appreciate that many modifications are possible in the example embodiments without materially departing from the novel teachings and advantages of the present inventive concepts. Accordingly, all such modifications are intended to be included within the scope of inventive concepts, as defined in the claims. It is to be understood that the foregoing is illustrative of various exemplary embodiments and is not to be construed as limited to the specific exemplary embodiments disclosed, and that modifications to the disclosed exemplary embodiments, as well as other exemplary embodiments, are intended to be included within the scope of the appended claims.

What is claimed is:

1. A semiconductor package comprising:
   a circuit board including a circuit pattern, a plurality of contact pads connected with the circuit pattern and a plurality of contact terminals making contact with an external contact element on a first surface thereof;
   an integrated circuit (IC) chip structure mounted on the circuit board and electrically connected to the circuit pattern, the IC chip structure having a plurality of memory cell arrays for storing data and a plurality of channel connection pads for transferring data signals to the memory cell arrays; and
   an operation controller for controlling operation of the semiconductor package, thereby changing a channel-mode operation of the semiconductor package, wherein the operation controller includes a channel controller for controlling an electrical connection between the circuit pattern and the channel connection pad, and includes a channel enable unit for selecting an active channel of the IC chip structure from among a plurality of channels and an operation sensing unit for detecting an operation state of a memory cell of the active channel.

2. The semiconductor package of claim 1, wherein the IC chip structure includes first and second dies on each of which memory cell arrays are arranged and the channel controller includes a first selection pad connected to a first channel connection pad of the first die, a second selection pad connected to a second channel connection pad of the second die and a switching unit electrically connecting the first and the second selection pads, so that the IC chip structure is operated in a 1-channel mode, having a single channel, or a 2-channel mode, having a pair of channels, under control of the switching unit.

3. The semiconductor package of claim 2, wherein the first channel connection pad of the first die includes a plurality of first unit bump pads that are connected to a first group of contact pads on a second surface of the circuit board and the first selection pad includes a plurality of first mirror pads that are connected to the first group of the contact pads through the circuit pattern;
   the second channel connection pad of the second die includes a plurality of second unit bump pads that are connected to a second group of the contact pads on the second surface of the circuit board and the second selection pad includes a plurality of second mirror pads that are connected to the second group of the contact pads through the circuit pattern and correspond to the first mirror pads one-to-one; and
   the switching unit individually controls every pair of the corresponding first and second mirror pads to be electrically connected to or disconnected from each other.

4. The semiconductor package of claim 3, wherein the switching unit includes a plurality of conductive lines interposed between each pair of the corresponding first and second mirror pads.

5. The semiconductor package of claim 3, wherein the first group of the contact pads is positioned at a side portion of the second surface of the circuit board, the second group of the contact pads is positioned at an opposite portion of the second surface of the circuit board, and the switching unit is positioned at a portion of the second surface of the circuit board between two side portions of the second surface of the circuit board.

6. The semiconductor package of claim 2, wherein the IC chip structure further includes a third die that is connected to the first die to thereby function as a first stack die and a fourth die that is connected to the second die to thereby function as a second stack die.

7. The semiconductor package of claim 1, wherein the IC chip structure includes at least one of a volatile memory device, a non-volatile memory device or a stack package in which the volatile memory device and the non-volatile memory device are stacked.

8. A semiconductor package comprising:
- a circuit board including a circuit pattern, a plurality of contact pads connected with the circuit pattern and a plurality of contact terminals making contact with an external contact element on a first surface thereof;
- an integrated circuit (IC) chip structure mounted on the circuit board and electrically connected to the circuit pattern, the IC chip structure having a plurality of memory cell arrays for storing data and a plurality of channel connection pads for transferring data signals to the memory cell arrays; and
- an operation controller for controlling operation of the semiconductor package, thereby changing a channel-mode operation of the semiconductor package, wherein the operation controller includes a bit organization controller for controlling an electrical connection between the circuit pattern and the contact terminal, thereby changing a bit organization structure between the external contact element and the IC chip structure.

9. The semiconductor package of claim 8, wherein the bit organization controller includes a first selection pad electrically connected to the contact terminals, a second selection pad electrically connected with the channel connection pad of the IC chip structure through the circuit pattern and a switching unit electrically connecting the first and the second selection pads, thereby controlling the number of data transfer lines through which electronic data is transferred to the memory cell arrays from the external contact element.

10. The semiconductor package of claim 9, wherein the first selection pad includes a plurality of mirror pads each of which is connected to the contact terminals, respectively, through the circuit pattern;
- the second selection pad includes a plurality of second mirror pads that is connected to a channel connection pad through the circuit pattern and corresponds to the first mirror pads one-to-one; and
- the switching unit individually controls every pair of the corresponding first and second mirror pads to be electrically connected to or disconnected from each other.

11. The semiconductor package of claim 9, wherein the electrical connection of the pairs of the first and the second mirror pads are selectively conducted by the switching unit from among a maximum number of data transfer lines, thereby selecting effective data transfer lines between the IC chip structure and the external contact element.

12. The semiconductor package of claim 11, wherein the effective data transfer lines include one of 4 lines, 8 lines, 16 lines and 32 lines within a maximum number of 32 data transfer lines.

13. The semiconductor package of claim 8, wherein the IC chip structure includes a flip chip structure.

* * * * *